United States Patent [19]

Mahopac

[11] 4,097,802
[45] Jun. 27, 1978

[54] MAGNETORESISTIVE FIELD SENSOR WITH A MAGNETIC SHIELD WHICH PREVENTS SENSOR RESPONSE AT FIELDS BELOW SATURATION OF THE SHIELD

[75] Inventors: Nickolas Joseph Mazzeo Mahopac; David A. Thompson, Somers, both of N.Y.

[73] Assignee: International Business Machines Corporation, Armonk, N.Y.

[21] Appl. No.: 592,135

[22] Filed: Jun. 30, 1975

[51] Int. Cl.² .............................................. G01R 33/02
[52] U.S. Cl. ................................... 324/252; 360/115; 338/32 R; 340/365 L; 365/158
[58] Field of Search ........................ 324/43 R, 45, 46; 360/111, 112, 113, 115; 338/32 R, 32 H; 340/174 TF, 365 L

[56] References Cited

U.S. PATENT DOCUMENTS

| | | | |
|---|---|---|---|
| 3,391,254 | 7/1968 | Honig | 360/115 |
| 3,693,085 | 9/1972 | Beard | 324/46 |
| 3,777,255 | 12/1973 | Young et al. | 324/34 PS |
| 3,840,898 | 10/1974 | Bajorek et al. | 360/113 |
| 3,864,751 | 2/1975 | Beaulieu et al. | 324/46 |

OTHER PUBLICATIONS

A. Bobeck; The Magnetic Bubble; Bell Lab. Record; vol. 48, pp. 162-169; Jun.-Jul. 1970.

*Primary Examiner*—Robert J. Corcoran
*Attorney, Agent, or Firm*—Graham S. Jones, II

[57] ABSTRACT

A thin film magnetoresistive sensor of NiFeCo is juxtaposed with a saturable thin film shield of more highly permeable NiFe material. The curve depicting change of resistance of the sensor as a function of applied magnetic field is flattened, permitting the sensor to provide a magnetic switch, such as a keyboard transducer, a sensor of current through wires, a magnetic bubble detector and a remote control scanning sensor in a recording head. The scanner involves a stepped arrangement for providing different levels of sensitivity for adjacent sections of the magnetoresistive sensor.

16 Claims, 10 Drawing Figures

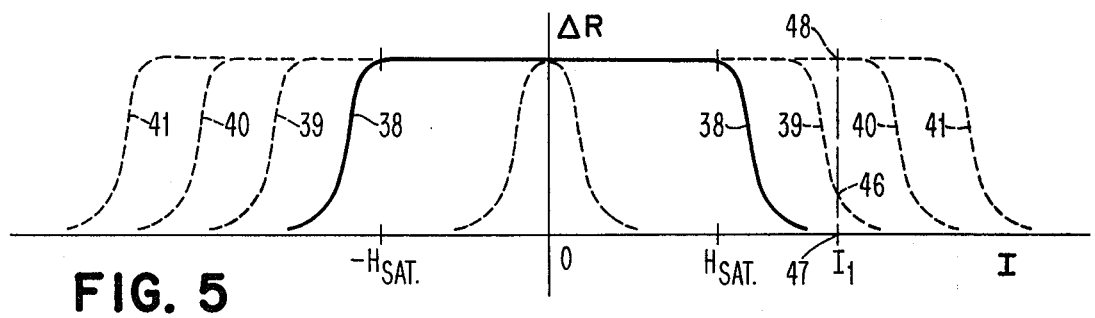
FIG. 5
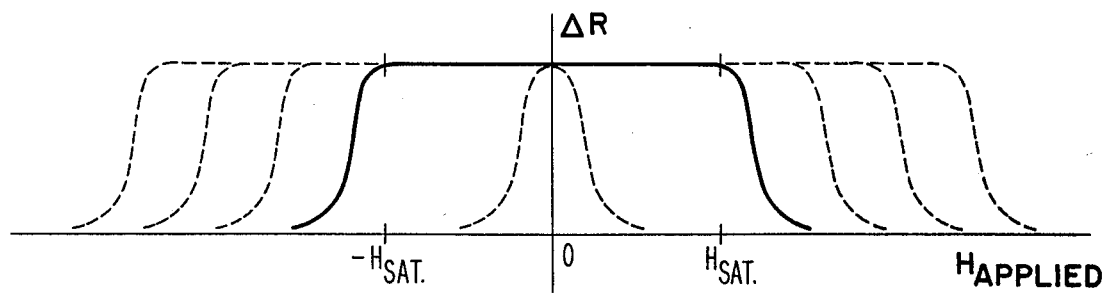
FIG. 7
FIG. 6
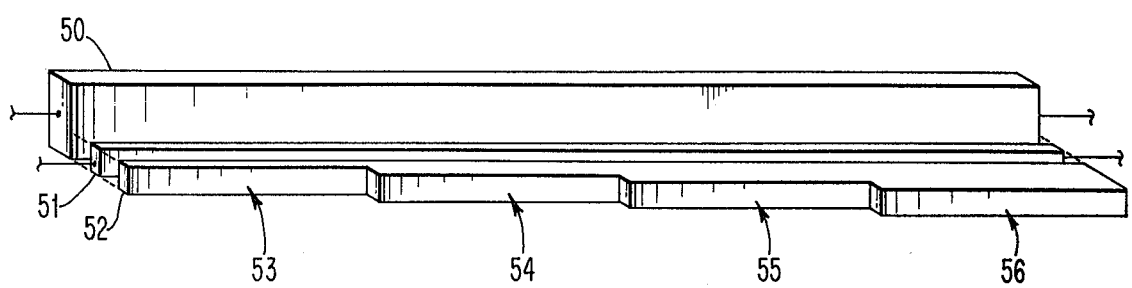

MAGNETORESISTIVE FIELD SENSOR WITH A MAGNETIC SHIELD WHICH PREVENTS SENSOR RESPONSE AT FIELDS BELOW SATURATION OF THE SHIELD

BACKGROUND OF THE INVENTION

1. Field of the Invention

This invention relates to magnetic field sensing devices and, more particularly, to such devices incorporating shielding material in juxtaposition with the sensor.

2. Description of the Prior Art

U.S. Pat. No. 3,432,837 of Fan, entitled, "Sensor Magnetic Head With Magnetic Material on a Gap Bridge," describes a magnetic head having a relatively high permeability. Between the head and the magnetic recording medium is interposed a thin magnetic layer of much less permeance than the magnetic sensor of the head. The purpose of the thin layer is to enhance the signal-to-noise ratio and to protect the sensor from abrasion and to provide a bridge for the magnetic fields from the magnetic recording medium to the head. The signal-to-noise ratio is stated to be improved by the fact that the thin layer permits bringing the abrasive recording medium closer to the sensor material by providing the protection from abrasion of the sensor by the intermediate thin layer of a material such as NiFe, CoNi, and Fe. See Col. 3, lines 17–22. This is the case because the purpose of the layer is to couple the magnetic field to the sensor, not to direct the field from the sensor. Thus, this prior art teaches provision of an intermediate magnetic member having the opposite permeability relationship for quite a different purpose.

An article entitled, "Magnetic Scan Head for High-Frequency Recording," by Camras in IEEE Transactions on Magnetics, Vol. MAG-3, No. 2, June 1967, pp. 96–100, describes a magnetic scan head with separate cores and a ribbon winding plus a sweep winding which are both used to activate selectively the separate cores, one at a time.

Another article by D. A. Thompson entitled, "Acoustically Scanned Magnetoresistive Transducer," IBM Technical Disclosure Bulletin, Vol. 17, No. 10, March 1975, pp. 3173-4, describes a scanning mechanism for a magnetoresistor which involves scanning in response to acoustic waves. This type of scanning control scans instantaneously across all of the segments of the head serially as the acoustic wave travels along the head rather than permitting selective actuation of a given segment of the head independently for whatever length of time desired.

DEFINITIONS

In the following text, the term "permeance" has its conventional meaning, i.e., the reciprocal of the magnetic reluctance. For a thin magnetic film, the permeance to magnetic flux for a path in the plane of the film is proportional to the relative permeability and the thickness.

The term "saturating field" shall mean the magnetic field H sufficient to cause a substantial decrease in incremental permeability. Permalloy NiFe alloy material, the most common thin film magnetic material, can be fabricated with a uniaxial anisotropy which is evidenced by mutually perpendicular "hard axis" and "easy axis" directions in the plane of the film. When magnetized along the hard axis direction, such permalloy material shows a large constant relative permeability (typically 5000) until saturation occurs at the saturating field $H_k$ (typically 2 Oersteds). As the applied field is further increased, the incremental relative permeability is much less than before saturation (typically 100 times smaller).

The preferred embodiment of this invention utilizes uniaxial a permalloy material or NiFeCo film subjected to magnetic fields along its hard axis direction. It is recognized, however, that all magnetic materials show saturation phenomena, although less ideally abrupt than for permalloy material, and that many of them are suitable for the purposes of this invention.

A "galvomagnetic thin film device" can include a Hall effect sensor as well as a magnetoresistive sensor.

SUMMARY OF THE INVENTION

In accordance with this invention, a structure including a magnetic sensor is provided. The magnetic sensor has a first level of permeance and a first level of saturating field. A saturable body of magnetic material having a higher level of permeance and a lower level of saturating field is juxtaposed with the sensor so that the sensor has a range of sensitivity above a predetermined field level caused by lesser fields being absorbed by the body of magnetic material. Further in accordance with this invention, a magnetoresistive magnetic field sensor consists of a thin film stripe of ferromagnetic metal having current-carrying leads attached. A second highly permeable film stripe is electrically insulated from the first. A source of electrical current passes through the first film stripe and an electrical means uses the current to detect resistance change in the film, such that the current passing through the first stripe does not produce a field strong enough to saturate the second stripe and such that the net internal magnetic field required to saturate the first film is at least two times that required to saturate the second film.

In another aspect of this invention, there is provision for use of a magnetic sensor and a saturable body of magnetic material juxtaposed with it. Adjacent to these is a variable source of a biasing magnetic field. Along the length of the sensor, the effective field reaching it varies either by variation in the cross-sectional area of the variable source or of the saturable body for the purpose of providing a multiple track head.

An object of this invention is to provide a new form of magnetic field sensor having an improved response characteristic.

A further object of this invention is to provide an improved magnetoresistive sensor for bubbles, a novel keyboard actuator, or a novel scannable magnetic head.

BRIEF DESCRIPTION OF THE DRAWINGS

FIG. 5 is a set of curves of change of resistance ($\Delta R$) of the head of FIGS. 3 and 4 showing curves for the various sections of the bias conductor as a function of bias conductor current (I).

FIG. 6 is a scannable head different from FIG. 3, principally because the variable cross-sectional area is provided in the magnetically saturable shield to provide a range of magnetic fields to the sensor.

FIG. 7 shows a curve of ΔR versus H APPLIED for the head of FIG. 6, with similar curves to those shown in FIG. 5 as a function of cross-sectional area.

DESCRIPTION OF A PREFERRED EMBODIMENT

Figure 1:
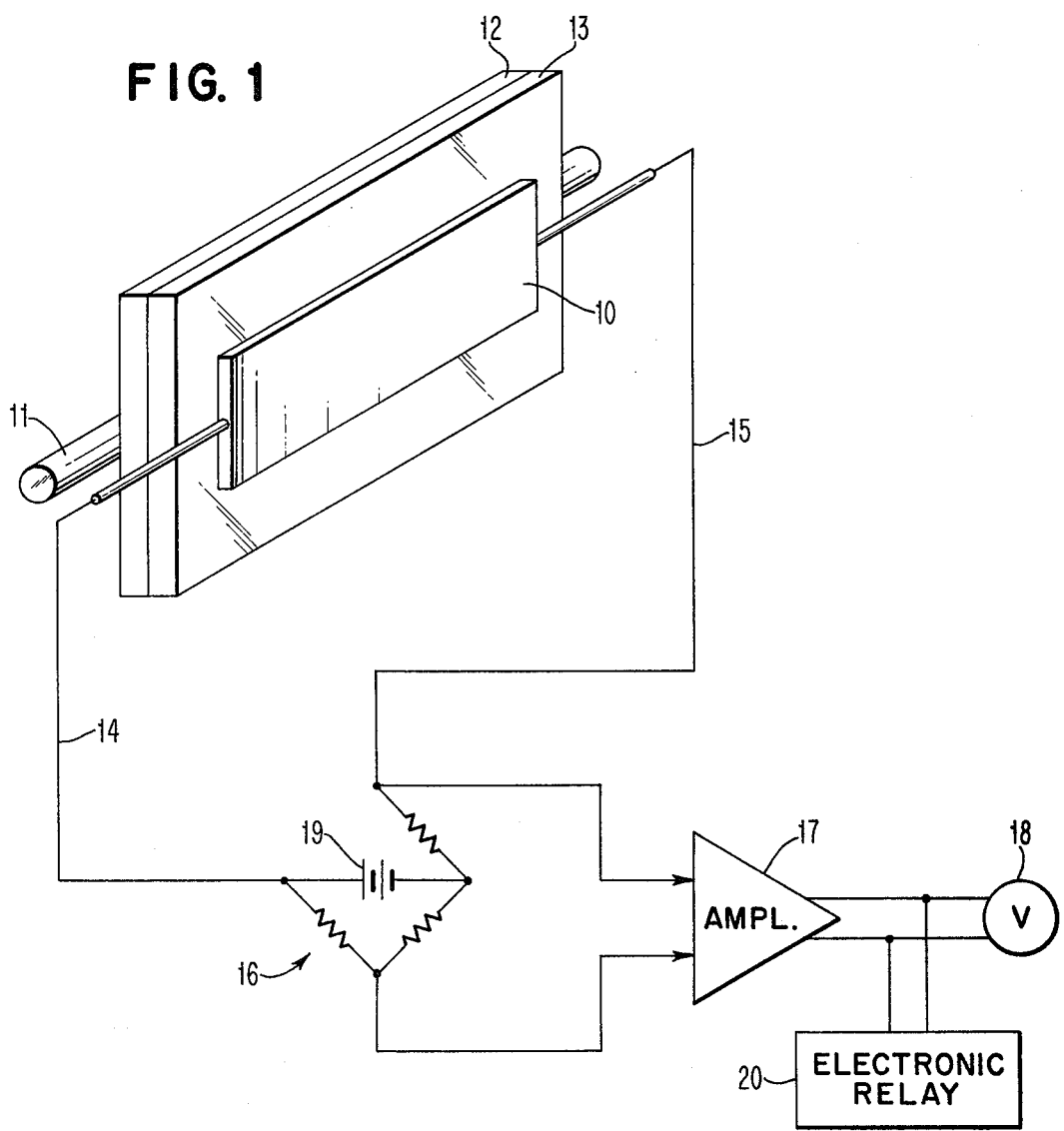
FIG. 1 shows a magnetoresistive sensor coupled to a measuring circuit and a magnetically saturable shield adjacent a magnetic field producing conductor.

FIG. 1 shows a magnetoresistive sensor 10 for sensing the magnetic field from a magnetic field source illustrated by electrical wire 11. Sensor 10 is deposited adjacent to a silicon dioxide layer 13. On the opposite side of layer 13 is a layer 12 of a highly permeable material such as permalloy with an $H_k$ of 2 Oersteds. The sensor 10 is composed of a less permeable material such as NiFeCo with an $H_k$ of 10 Oersteds. Because of its relatively higher permeance, layer 12 absorbs the majority of smaller magnetic fields from wire 11, protecting or shielding such fields from reaching sensor 10. However, larger magnetic fields saturate layer 12 and have an increasing effect upon sensor 10 as they increase in magnitude.

The sensor 10 has electrical leads 14 and 15 connected to its opposite ends. Leads 14 and 15 connect the sensor 10 as one leg in a Wheatstone bridge 16. The battery 19 connected to the bridge produces a current through the bridge including sensor 10. Then, when the field from wire 11 is large enough, the resistance of sensor 10 is varied as a function of the magnetic field.

Figure 2:
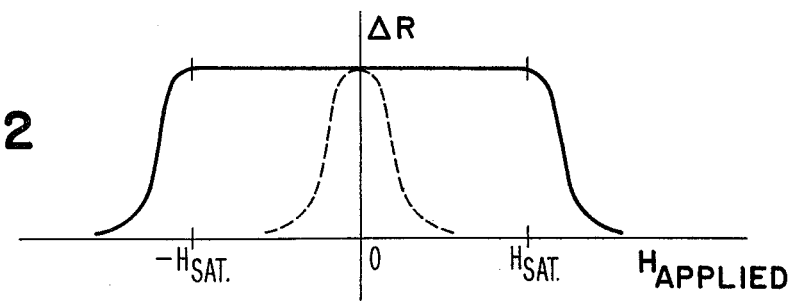
FIG. 2 shows the change in resistance ($\Delta R$) of the sensor of FIG. 1 as a function of the magnetic bias field applied from the conductor.

FIG. 2 shows a dotted line curve of change in resistance ΔR versus applied magnetic field for a magnetoresistive sensor such as sensor 10 are shown in FIG. 1 without any shielding layer 12. As the magnetic field applied increases in the positive or negative direction from zero, the resistance ΔR decreases relatively sharply to a minimum value, where it remains. FIG. 2 also shows a solid line curve which applies to the sensor shown in FIG. 1 including the shielding layer 12. In this case, ΔR remains constant as a function of applied magnetic field until the saturation of layer 12 occurs, at which time the value ΔR declines in a similar manner to the dotted line curve. The result is that the sensor is insensitive to variations in applied field for a range of small field values and has a sharp decline. Thus, the device of FIG. 1 can be used to drive a voltmeter 18 via amplifier 17, or it can be used to operate an electronic relay 20 as a function of current levels applied with elements 10, 11, 12, and 13 operating as a form of transducer for switching on and off as a function of the level of the magnetic field.

Figure 3:
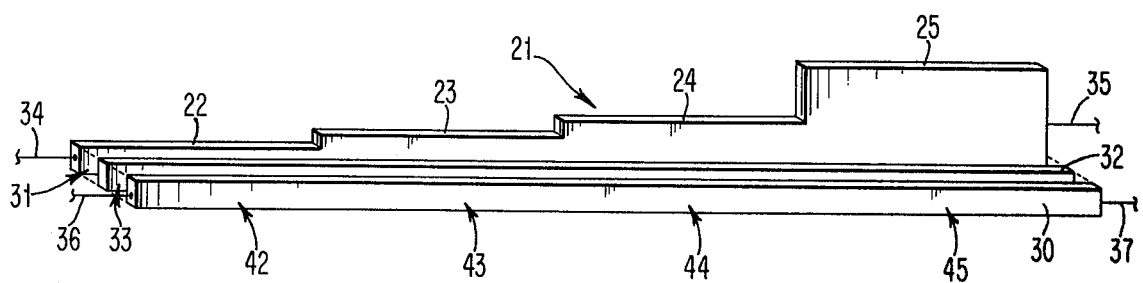
FIG. 3 shows a scannable magnetoresistive strip head which uses a variable cross-section bias field conductor to provide variable magnetic fields to the saturable shield.
Figure 4:
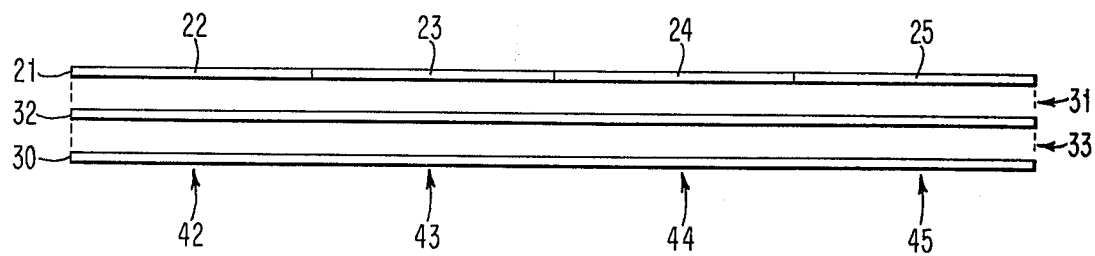
FIG. 4 is a plan view of the head of FIG. 3.

FIGS. 3 and 4 show a conductor 21 of generally rectangular cross-section having widths at portion 22 of about 10μ, portion 23 - 13 μ, portion 24 - 20μ, portion 25 - 40μ. A parallel shield layer 32 is separated from conductor 21 by insulator 31, and layer 32 is separated from a parallel magnetoresistive strip layer 30 by insulator 33. As an example, a copper conductor 21 is about 10,000A thick, insulating spacer 31 of $SiO_2$ is 50,000A thick, shield 32 of NiFe is 200A thick, insulating spacer 33 is 1,000A thick and sensor 30 of NiFeCo is 200A thick. Again, shield 32 has an $H_k$ of 2 Oersteds and sensor 30 has an $H_k$ of 10 Oersteds.

The apparatus of FIGS. 3 and 4 permits a scanning D.C. voltage such as a sawtooth wave to be applied across ends 34 and 35 of conductor 21 to provide an ever-increasing magnetic field about the shield 32 and sensor 30. Assuming that the conductor 22 is similar in cross-sectional area to the conductor 11 in FIG. 1, for a similar current, the curve 38 in FIG. 5 for ΔR in sensor section 42 versus I current through conductor 21 is obtained across terminals 36, 37 of sensor 30 as a result of the influence of the current in conductor section 22 acting on sensor section 42. Similar curves 39, 40 and 41 shown in dotted form apply for sections 23, 24 and 25 of conductor 21. The wider sections of conductor 21 produce weaker magnetic fields than the narrower sections. Theoretically, the bias field from conductor 21 follows the equation as follows:

H bias (bias field) = I/2W

W = width of current carrying conductor

I = current through wire

Thus, the H bias for the 10μ wide section 22 would be four times higher than that for the 40μ wide section 25, according to the formula. This can be seen with reference to FIG. 5 because curve 38 has its break first for section 22 and curves 39–41 break successively later.

Thus, as desired, the current through conductor 21 can be varied to set one of the corresponding segments 42, 43, 44, or 45 of sensor 30 into its most sensitive position with all other segments biased to insensitivity to small magnetic fields for those with low bias and total insensitivity for those which are saturated. Once this has been done and, say, curve 39 has been brought to point 46 for current $I_1$, section 43 of sensor 30 can be used to sense a source of a magnetic field such as a track of a magnetic recording medium juxtaposed with it. Note that curve 38 is at point 47 for the bias current $I_1$ for point 46, so section 42 is saturated. Point 48 on curves 40 and 41 for sections 44 and 45 shows that those sensor sections are as yet insensitive for current $I_1$. In this way, a head in a fixed position in space can be caused to scan several different recording track positions.

In FIG. 6, a different arrangement is provided in which the bias conductor 50 is of a uniform width and 20,000A thick. The MR stripe sensor 51, preferably of NiFeCo, is also of uniform thickness, such as 200A, but the shield 52, preferably of NiFe, which is now on the opposite side of sensor 51 is of stepped thicknesses of 200A at section 53, 400A at section 59, 600A at section 55 and 800A at section 56. The sections 53–56 are preferably about 350μ long per section for a total of 1,400μ for the four sections shown. In this case, the magnetic field applied to saturate the shield sections 53–56 increases as a direct function of the thicknesses of the films 53–56. In this case also, the current through conductor 50 can be set at various levels to scan to activate the desired adjacent segment of the sensor 51 by means of a set of ΔR vs. H APPLIED curves shown in FIG. 7 which are analogous to those shown for ΔR vs. I in FIG. 5. This arrangement can also be used to scan a plurality of tracks of a magnetic recording medium. In other words, when the conductor 50 carries a uniform bias current for applying a uniform magnetic field, the resultant threshold field seen by the sensor 51 varies along its length, so that there is a distinct set of uniform bias currents through conductor 50, each of which results in one particular portion of sensor 51 being biased at its level of sensitivity or at its threshold bias condition. All other portions are biased so as to be substantially insensitive to small fluctuations in magnetic field.

Figure 8:
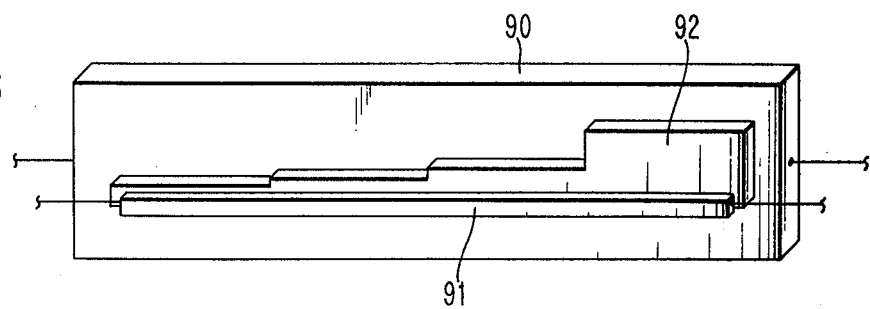
FIG. 8 shows a scannable magnetoresistive strip head which uses a variable width of the saturable shield to provide a range of magnetic fields to the sensor.

FIG. 8 shows a different arrangement in which the bias conductor 90, the sensor 91, and the shield 92 are all of uniform thickness, but the width of the shield is of stepped width so as to saturate for different values of current in the bias conductor.

Figure 9:
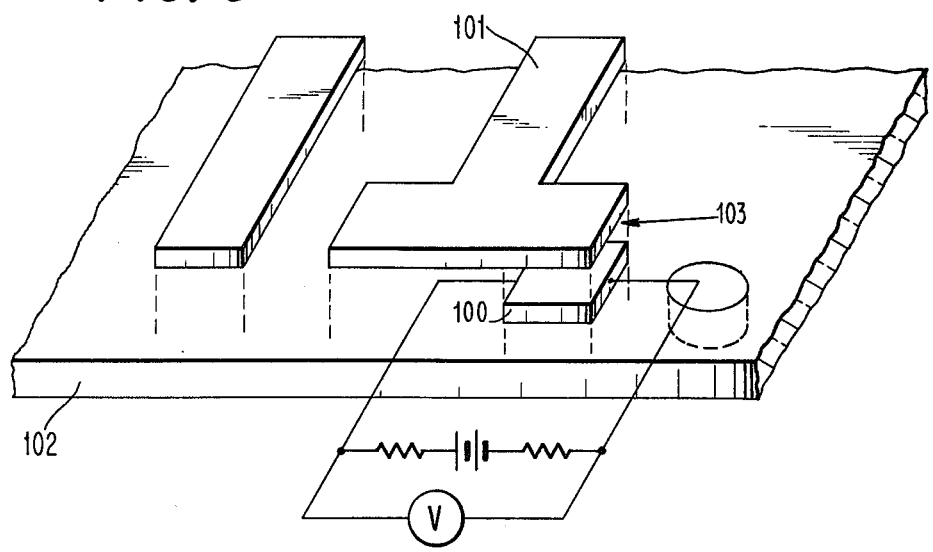
FIG. 9 shows a magnetoresistive bubble sensor having a saturable shield element.

FIG. 9 shows a magnetic bubble sensing arrangement in which a magnetoresistive sensor 100 is fabricated in flux coupling proximity with a magnetic shielding layer 101, which can also be part of the bubble propagation pattern. The shielding layer 101 absorbs a substantial portion of the rotating field used to propagate magnetic bubbles in the magnetic bubble medium 102, but is essentially saturated in the presence of the additional magnetic flux arising from the presence of a magnetic bubble in close proximity to the magnetoresistive sensor 100, which is separated by insulating layer 103 from layer 101.

Figure 10:
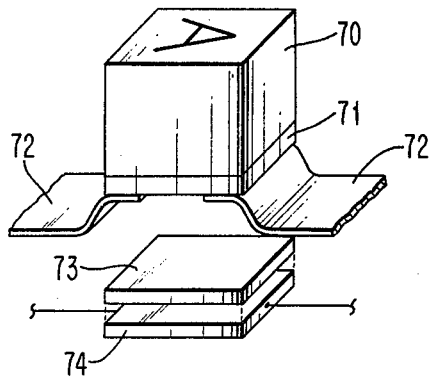
FIG. 10 is a drawing of a magnetic typewriter keyboard actuator in accordance with this invention.

FIG. 10 shows a typewriter key 70 with a permanent magnet 71 adhering to the base of key 70. Springs 72 bias the key 70 and magnet 71 away from shield 73 and MR sensor 74.

FIG. 1, as shown, provides an overload detector provided that saturation of the shield occurs essentially at the threshold current value.

Although the previous explanation has treated the magnetoresistive sensor as if it were a simple stripe etched from a magnetic thin film, the inventors recognize a number of refinements which are known in the art and which may be substituted for the purpose of additional magnetic biasing (see, for example, U.S. Pat. No. 3,840,898 to Bajorek et al), conductor stripe overlays for the purpose of altering the current flow pattern in the sensor (see, for example, Paper 16-5 entitled "The Barber Pole, a Linear Magnetoresistive Head," by Kuijk, van Gestel and Gorter, Digest of the Intermag Conference [IEEE], 1975), etching and additional lead attachments so that the sensor contains more of the elements of the electrical bridge network and a four-conductor arrangement using the so-called "planar Hall effect" or the true Hall effect. Any galvanomagnetic sensor fabricated from a magnetic thin film can be substituted for the simple magnetoresistive stripe previously described. It should also be noted that the order of deposition of the sensor and shield layers is not critical in many applications, and can be reversed, provided that they remain in close flux-coupling proximity.

What is claimed is:
1. Magnetic apparatus including a galvomagnetic sensor having a first level of permeance,
   a magnetically saturable shielding body of material having a substantially higher level of permeance juxtaposed with said sensor,
   a variable source of magnetic field being provided adjacent to said sensor and said shielding body, and
   magnetic field level means being provided for providing a variable level of magnetic field along the length of said sensor.
2. Apparatus in accordance with claim 1 wherein said sensor comprises a galvanomagnetic thin film device.
3. Apparatus in accordance with claim 1 wherein said sensor comprises a magnetoresistor.
4. Apparatus in accordance with claim 3 wherein said magnetoresistor comprises a thin film strip deposited upon one side of a thin film of a substantially non-magnetic material with said body of magnetic material comprising a layer on the other side of said non-magnetic material.
5. Magnetic apparatus including a magnetic sensor having a first level of permeance,
   a magnetically saturable shielding body of material having a substantially higher level of permeance juxtaposed with said sensor, a variable source of magnetic field being provided adjacent to said sensor and said shielding body,
   magnetic field level means being provided for providing a variable level of magnetic field along the length of said sensor, and
   said magnetic field level means comprising variation in the cross-sectional area of said variable source of magnetic field along the length of said sensor.
6. Apparatus in accordance with claim 1 wherein said magnetic field level means comprises variation in the cross-sectional area of said shielding body of magnetic material along the length of said sensor.
7. Apparatus in accordance with claim 5 wherein said variable source comprises an electrical conductor having a variable cross-sectional area increasing at predetermined steps along the length of said sensor.
8. Apparatus in accordance with claim 6 wherein said shielding body comprises a thin film of permeable material having a variable cross-sectional area increased stepwise along the length of said sensor.
9. A circuit overload detector consisting of a current carrying conductor,
   a magnetoresistive magnetic field sensor consisting of a first thin film sensor stripe composed of a magnetoresistive ferromagnetic metal having current-carrying leads attached,
   a second highly permeable, thin film magnetic-shielding stripe electrically insulated from said sensor and juxtaposed with said sensor stripe and being designed and located between said sensor stripe and said conductor to absorb substantially all of smaller magnetic fields from said conductor for shielding said fields from reaching said sensor stripe, whereby the resistance of said sensor stripe remains substantially constant below magnetic saturation Hsat of said shielding stripe and varies significantly above that value,
   means connected to said leads for providing electrical current through said sensor stripe and an electrical detector means for measuring said current to detect resistance change in said sensor stripe, said shielding stripe having a greater permeance than said sensor stripe, said permeance being sufficient so that the current passing through said sensor stripe does not produce a field strong enough to saturate said shielding stripe, and
   said current-carrying conductor carrying current from a circuit to be monitored, producing a magnetic field coupled to said sensor only when it is more than sufficient to saturate said shielding film,
   said magnetic-shielding stripe absorbing the majority of smaller levels of said magnetic field from said conductor and having an Hsat above which larger levels of magnetic field saturate said shielding stripe and said larger levels of magnetic field hav- ing an increased magnetic effect upon said sensor stripe as they increase in magnitude.

10. A magnetic scan head for providing a flux linking window along a magnetoresistive sensor, including, a first thin film magnetoresistive sensor layer adapted to read data stored on a magnetic medium, a magnetic shunt means adjacent to said sensor layer composed of permeable material, bias means for applying a value of magnetic field bias selected from a range of values for a magnetic field to said sensor layer and to said shunt means, means for varying the magnetic field from said bias means applied to said sensor layer along the length of said sensor layer as a function of said length, said shunt providing shielding of said magnetic field from said sensor layer below a predetermined level of magnetic field from said bias means and said sensor layer being saturated above a predetermined higher level of magnetic field from said bias means, for each given point on said sensor layer, said predetermined levels varying along the length of said sensor layer as a function of said length, whereby a flux linking window of said sensing layer can be activated for a segment of said layer as a function of the strength of said magnetic field.

11. A magnetic scan magnetoresistive sensor having a flux linking window along the length thereof, including, a first thin film magnetoresistive sensor layer, a magnetic shunt means adjacent to said sensor layer composed of permeable material, bias means for applying a value of magnetic field bias selected from a range of values for a magnetic field to said sensor layer and to said shunt means, means for varying the magnetic field from said bias means applied to said sensor layer along the length of said sensor layer as a function of said length, said shunt providing shielding of said magnetic field from said sensor layer below a predetermined level of magnetic field from said bias means and said sensor layer being saturated above a predetermined higher level of magnetic field from said bias means, for each given point on said sensor layer, said predetermined levels varying along the length of said sensor layer as a function of said length, whereby a flux linking window of said sensor layer can be activated for a segment of said layer as a function of the strength of said magnetic field.

12. Apparatus in accordance with claim 5 wherein said variable source comprises an electrical conductor having a variable cross-sectional area increasing at predetermined steps for providing a plurality of segments for providing greater magnetic sensitivity for selected segments of said sensor, as a function of the current through said conductor.

13. Apparatus in accordance with claim 6 wherein said body comprises a thin film of permeable material having a variable cross-sectional area increased stepwise along the length of said sensor for providing a plurality of segments of said sensor.

14. Magnetic switching apparatus for a keyboard comprising a magnetoresistive magnetic field sensor consisting of
a first thin film sensor stripe having a substantially nonlinear $\Delta R$ vs. H applied curve changing relatively sharply as a function of a magnetic field H applied reaching said sensor stripe, composed of a magnetoresistive ferromagnetic metal having current-carrying leads attached, a second highly permeable, thin film magnetic-shielding stripe electrically insulated from said sensor stripe and juxtaposed with said sensor stripe, means connected to said leads for providing electrical current through said sensor stripe and an electrical detector means for measuring said current to detect resistance change in said sensor stripe, said shielding stripe having a greater permeance than said sensor stripe and being designed and located to absorb substantially all of smaller magnetic fields from a magnetic source on the opposite side of said shielding stripe from said sensor stripe, said permeance being sufficient so that the current passing through said sensor stripe does not produce a field strong enough to saturate said shielding stripe, and a movable actuator member comprising a keyboard key including a key secured to a permanent magnetic body reciprocable towards and away from said sensor to provide a magnetic field saturating said shielding stripe and actuating said sensor stripe as a function of said reciprocation and the resistance of said sensor stripe remains constant until the key is actuated to raise the shielding stripe into magnetic saturation Hsat, causing a substantial change in resistance of said sensor stripe in response to motion of said key wherein said magnetic body comprises said magnetic source.

15. Magnetic apparatus including a magnetoresistor sensor for sensing a magnetic field and said sensor having a first level of permeance, a magnetic field source located in a predetermined position relative to said sensor, a magnetically saturable shielding body of material having a substantially higher level of permeance juxtaposed with said sensor and being designed and located between said sensor and said source to absorb substantially all of smaller magnetic fields from said source for shielding said fields from reaching said sensor whereby the resistance of said sensor stripe remains substantially constant below magnetic saturation $H_{SAT}$ of said shielding stripe and varies significantly above that value, and said magnetic field source being juxtaposed with said sensor and said shielding body, said source being adapted to vary the magnetic field about said sensor and said shielding body above and below the saturation level of said body, said magnetoresistive sensor comprising a thin film strip deposited upon one side of a thin film of a substantially non-magnetic material with said shielding body of magnetic material comprising a layer on the other side of said non-magnetic material.

16. A magnetoresistive magnetic field sensor having a range of sensitivity above a predetermined field level, consisting of a first thin film sensor stripe composed of a magnetoresistive ferromagnetic matal having current-carrying leads attached, said sensor stripe providing a change in resistance $\Delta R$ versus magnetic field H applied characteristic with $\Delta R$ changing relatively sharply as a function of a magnetic field H applied reaching said sensor stripe, a second highly permeable, thin film magnetic-shielding stripe electrically insulated from said sensor stripe juxtaposed with said sensor stripe, means connected to said leads for providing electrical current through said sensor stripe and an electrical detector means for measuring said current to detect resistance change in said sensor stripe, said shielding stripe having a greater permeance than said sensor stripe, said permeance being sufficient so that the current passing through said sensor stripe does not produce a field strong enough to saturate said shielding stripe, said shielding stripe being designed and located to absorb substantially all of smaller externally applied magnetic fields from a predetermined source for shielding such fields from reaching said sensor stripe whereby the resistance of said sensor stripe remains substantially constant below magnetic saturation Hsat of said shielding stripe and varies significantly above that value, thereby maintaining a substantially constant value of ΔR of said sensor stripe as a function of the portion of said externally applied magnetic fields reaching said sensor stripe for said smaller magnetic fields, and said shielding stripe being saturated by larger externally applied magnetic fields thereby exposing said sensor stripe to large enough values of said externally applied magnetic field to cause said value of ΔR to change relatively sharply as a function of the value of said externally applied magnetic field directed at said shielding stripe and said sensor stripe, whereby said larger externally applied magnetic fields have an increasing effect upon said sensor stripe as said magnetic fields increase in magnitude.

* * * * *